United States Patent
Bartholomeusz et al.

(10) Patent No.: US 8,912,618 B2
(45) Date of Patent: Dec. 16, 2014

(54) DEPOSITION OF PHOTOVOLTAIC THIN FILMS BY PLASMA SPRAY DEPOSITION

(71) Applicants: Brian Josef Bartholomeusz, Palo Alto, CA (US); Michael Bartholomeusz, Phoenix, AZ (US)

(72) Inventors: Brian Josef Bartholomeusz, Palo Alto, CA (US); Michael Bartholomeusz, Phoenix, AZ (US)

(73) Assignee: AQT Solar, Inc., Sunnyvale, CA (US)

( * ) Notice: Subject to any disclaimer, the term of this patent is extended or adjusted under 35 U.S.C. 154(b) by 0 days.

(21) Appl. No.: 13/775,676

(22) Filed: Feb. 25, 2013

(65) Prior Publication Data

US 2013/0167914 A1 Jul. 4, 2013

Related U.S. Application Data

(63) Continuation of application No. 12/716,024, filed on Mar. 2, 2010, now Pat. No. 8,383,451.

(60) Provisional application No. 61/158,654, filed on Mar. 9, 2009.

(51) Int. Cl.
*H01L 31/00* (2006.01)

(52) U.S. Cl.
USPC .......... 257/459; 257/431; 257/432; 257/458

(58) Field of Classification Search
USPC ........ 257/21–22; 438/57, 73–76, 963, 96–98, 438/95–96, 80, 753, E31.001; 136/255–256, 264–265
See application file for complete search history.

(56) References Cited

U.S. PATENT DOCUMENTS

| | | | |
|---|---|---|---|
| 6,566,159 B2 | 5/2003 | Sawada et al. | |
| 8,158,880 B1 * | 4/2012 | Girt et al. | 136/255 |
| 8,373,060 B2 * | 2/2013 | Munteanu et al. | 136/255 |
| 2006/0107996 A1 * | 5/2006 | Shaheen et al. | 136/263 |

* cited by examiner

*Primary Examiner* — Dung A. Le
(74) *Attorney, Agent, or Firm* — Mattingly & Malur, PC

(57) ABSTRACT

In particular embodiments, a method is described for depositing thin films, such as those used in forming a photovoltaic cell or device. In a particular embodiment, the method includes providing a substrate suitable for use in a photovoltaic device and plasma spraying one or more layers over the substrate, the grain size of the grains in each of the one or more layers being at least approximately two times greater than the thickness of the respective layer.

3 Claims, 3 Drawing Sheets

DEPOSITION OF PHOTOVOLTAIC THIN FILMS BY PLASMA SPRAY DEPOSITION

RELATED APPLICATIONS

This application claims the benefit, under 35 U.S.C. §119 (e), of U.S. Provisional Patent Application No. 61/158,654, entitled DEPOSITION OF PHOTOVOLTAIC THIN FILMS BY PLASMA SPRAY DEPOSITION, filed 9 Mar. 2009, and hereby incorporated by reference herein.

TECHNICAL FIELD

The present disclosure generally relates to thin film deposition, and more particularly, to depositing thin films using plasma spraying techniques.

BACKGROUND

P-n junction based photovoltaic cells are commonly used as solar cells. Generally, p-n junction based photovoltaic cells include a layer of an n-type semiconductor in direct contact with a layer of a p-type semiconductor. By way of background, when a p-type semiconductor is positioned in intimate contact with an n-type semiconductor a diffusion of electrons occurs from the region of high electron concentration (the n-type side of the junction) into the region of low electron concentration (the p-type side of the junction). However, the diffusion of charge carriers (electrons) does not happen indefinitely, as an opposing electric field is created by this charge imbalance. The electric field established across the p-n junction induces a separation of charge carriers that are created as result of photon absorption.

Chalcogenide (both single and mixed) semiconductors have optical band gaps well within the terrestrial solar spectrum, and hence, can be used as photon absorbers in thin film based photovoltaic cells, such as solar cells, to generate electron-hole pairs and convert light energy to usable electrical energy. More specifically, semiconducting chalcogenide films are typically used as the absorber layers in such devices. A chalcogenide is a chemical compound consisting of at least one chalcogen ion (group 16 (VIA) elements in the periodic table, e.g., sulfur (S), selenium (Se), and tellurium (Te)) and at least one more electropositive element. As those of skill in the art will appreciate, references to chalcogenides are generally made in reference to sulfides, selenides, and tellurides. Thin film based solar cell devices may utilize these chalcogenide semiconductor materials as the absorber layer(s) as is or, alternately, in the form of an alloy with other elements or even compounds such as oxides, nitrides and carbides, among others.

Numerous deposition methods have been proposed for the preparation of the photovoltaic absorber layers, among other thin films, and their precursors. By way of example, such photovoltaic absorbers include CdTe, $CuInS_2$, $Cu(InGa)Se_2$, and $CuInSe_2$, among others, while their precursors include, by way of example, CuIn, CuGaIn, and $In_2S_3$/Cu, among others. Conventionally, in the case of precursors, the constituent metallic components are first deposited onto a substrate and then the final compound, a chalcogenide having chalcopyrite phase, is obtained through thermo-chemical processing.

BRIEF DESCRIPTION OF THE DRAWINGS

The present disclosure is illustrated by way of example, and not by way of limitation, in the figures of the accompanying drawings and in which like reference numerals refer to similar elements and in which.

DESCRIPTION OF EXAMPLE EMBODIMENTS

The present disclosure is now described in detail with reference to a few particular embodiments thereof as illustrated in the accompanying drawings. In the following description, numerous specific details are set forth in order to provide a thorough understanding of the present disclosure. It is apparent, however, to one skilled in the art, that particular embodiments of the present disclosure may be practiced without some or all of these specific details. In other instances, well known process steps and/or structures have not been described in detail in order to not unnecessarily obscure the present disclosure. In addition, while the disclosure is described in conjunction with the particular embodiments, it should be understood that this description is not intended to limit the disclosure to the described embodiments. To the contrary, the description is intended to cover alternatives, modifications, and equivalents as may be included within the spirit and scope of the disclosure as defined by the appended claims.

Particular embodiments of the present disclosure relate to the use of Plasma Spray Deposition techniques in forming absorber structures for use in photovoltaic devices (hereinafter also referred to as "photovoltaic cells," "solar cells," or "solar device"). In particular embodiments, Plasma Spray Deposition is used in forming chalcogenide absorber layer structures. In particular embodiments, the disclosed techniques may result in chalcogenide absorber layer structures in which a majority of the materials forming the respective structures have chalcopyrite phase. In even more particular embodiments, greater than 90 percent of the resultant chalcogenide absorber layer structures are in the chalcopyrite phase after deposition by Plasma Spray Deposition, and in some embodiments, after subsequent thermo-processing such as annealing.

Hereinafter, reference to a layer may encompass a film, and vice versa, where appropriate. Additionally, reference to a layer may encompass a multilayer structure including one or more layers, where appropriate. As such, reference to an absorber may be made with reference to one or more absorber layers that collectively are referred to hereinafter as absorber, absorber layer, absorber structure, or absorber layer structure.

Figure 1A:
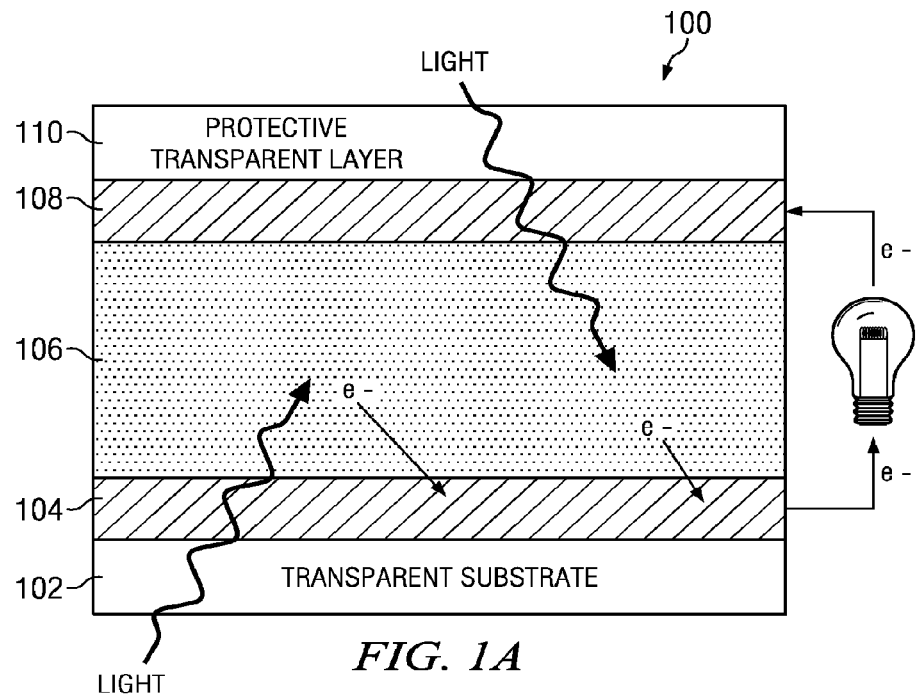
FIGS. 1A-1D each illustrate a diagrammatic cross-sectional side view of an example solar cell configuration.
Figure 1B:
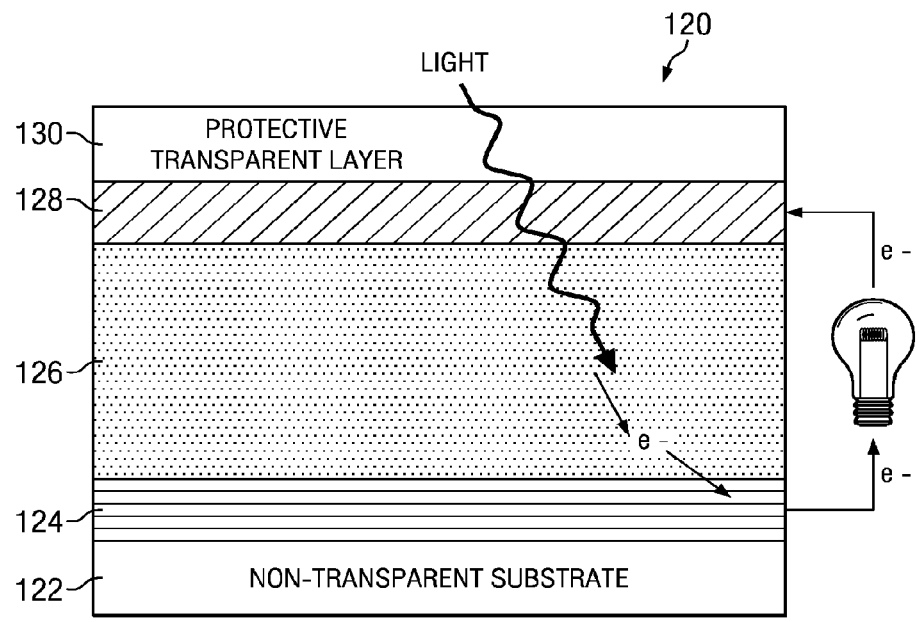
Figure 1C:
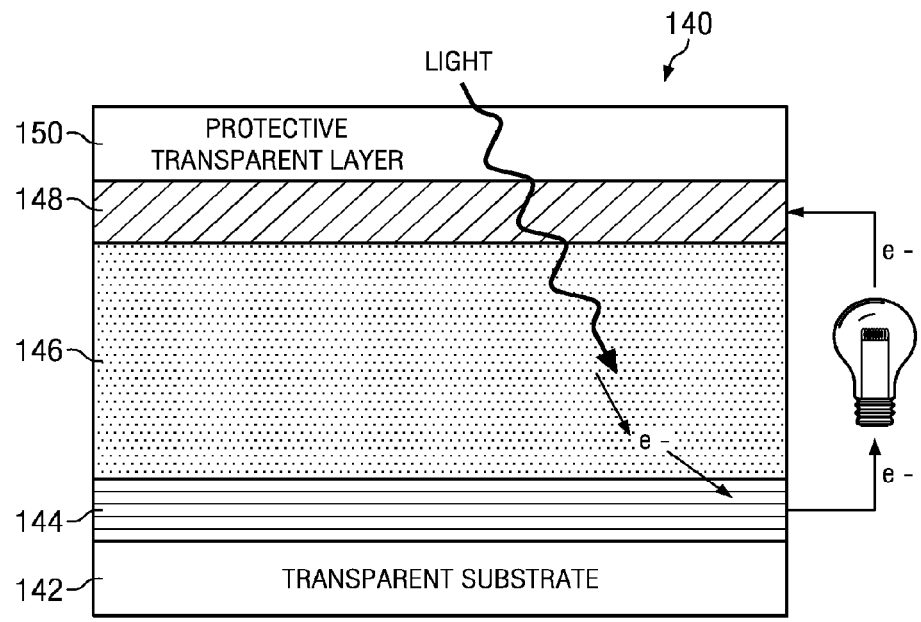
Figure 1D:
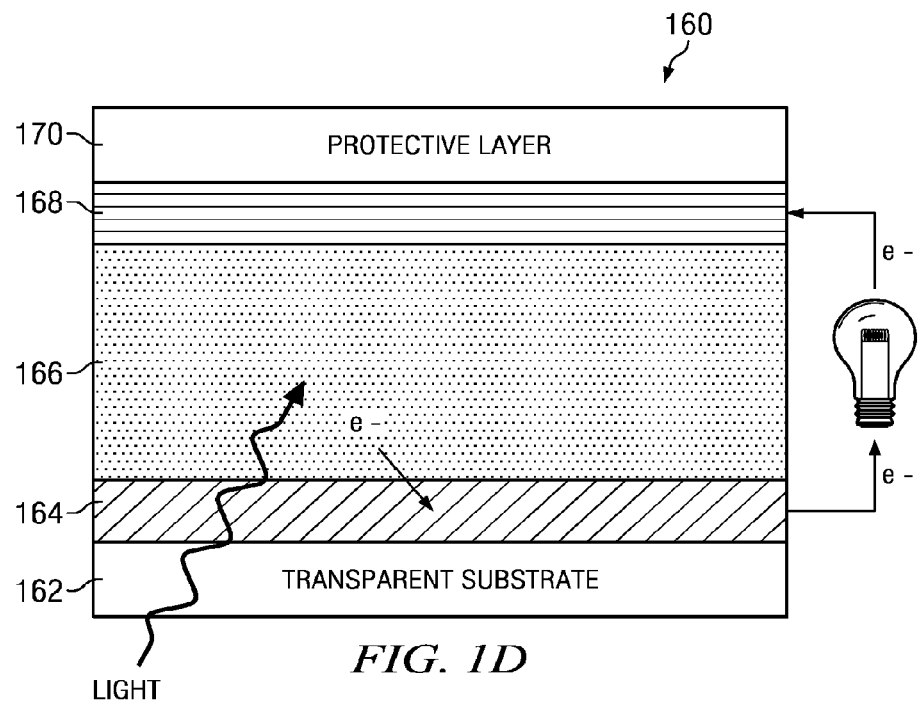

FIG. 1A illustrates an example solar cell 100 that includes, in overlying sequence, a transparent glass substrate 102, a transparent conductive layer 104, a conversion layer 106, a transparent conductive layer 108, and a protective transparent layer 110. In this example solar cell design, light can enter the solar cell 100 from the top (through the protective transparent layer 110) or from the bottom (through the transparent substrate 102). FIG. 1B illustrates another example solar cell 120 that includes, in overlying sequence, a non-transparent substrate (e.g., a metal, plastic, ceramic, or other suitable non-transparent substrate) 122, a conductive layer 124, a conversion layer 126, a transparent conductive layer 128, and a protective transparent layer 130. In this example solar cell design, light can enter the solar cell 120 from the top (through the protective transparent layer 130). FIG. 1C illustrates another example solar cell 140 that includes, in overlying sequence, a transparent substrate (e.g., a glass, plastic, or other suitable transparent substrate) 142, a conductive layer 144, a conversion layer 146, a transparent conductive layer 148, and a protective transparent layer 150. In this example solar cell design, light can enter the solar cell 140 from the top (through protective transparent layer 150). FIG. 1D illustrates yet another example solar cell 160 that includes, in overlying sequence, a transparent substrate (e.g., a glass, plastic, or other suitable transparent substrate) 162, a transparent conductive layer 164, a conversion layer 166, a conductive layer 168, and a protective layer 170. In this example solar cell design, light can enter the solar cell 160 from the bottom (through the transparent substrate 162).

In order to achieve charge separation (the separation of electron-hole pairs) during operation of the resultant photovoltaic devices, each of the conversion layers 106, 126, 146, and 166 are comprised of at least one n-type semiconductor material and at least one p-type semiconductor material. In particular embodiments, each of the conversion layers 106, 126, 146, and 166 are comprised of at least one or more absorber layers and one or more buffer layers having opposite doping as the absorber layers. By way of example, if the absorber layer is formed from a p-type semiconductor, the buffer layer is formed from an n-type semiconductor. On the other hand, if the absorber layer is formed from an n-type semiconductor, the buffer layer is formed from a p-type semiconductor. More particular embodiments of example conversion layers suitable for use as one or more of conversion layers 106, 126, 146, or 166 will be described later in the present disclosure.

In particular embodiments, each of the transparent conductive layers 104, 108, 128, 148, or 164 is comprised of at least one oxide layer. By way of example and not by way of limitation, the oxide layer forming the transparent conductive layer may include one or more layers each formed of one or more of: titanium oxide (e.g., one or more of TiO, TiO2, Ti2O3, or Ti3O5), aluminum oxide (e.g., Al2O3), cobalt oxide (e.g., one or more of CoO, Co2O3, or Co3O4), silicon oxide (e.g., SiO2), tin oxide (e.g., one or more of SnO or SnO2), zinc oxide (e.g., ZnO), molybdenum oxide (e.g., one or more of Mo, MoO2, or MoO3), tantalum oxide (e.g., one or more of TaO, TaO2, or Ta2O5), tungsten oxide (e.g., one or more of WO2 or WO3), indium oxide (e.g., one or more of InO or In2O3), magnesium oxide (e.g., MgO), bismuth oxide (e.g., Bi2O3), copper oxide (e.g., CuO), vanadium oxide (e.g., one or more of VO, VO2, V2O3, V2O5, or V3O5), chromium oxide (e.g., one or more of CrO2, CrO3, Cr2O3, or Cr3O4), zirconium oxide (e.g., ZrO2), or yttrium oxide (e.g., Y2O3). Additionally, in various embodiments, the oxide layer may be doped with one or more of a variety of suitable elements or compounds. In one particular embodiment, each of the transparent conductive layers 104, 108, 128, 148, or 164 may be comprised of ZnO doped with at least one of: aluminum oxide, titanium oxide, zirconium oxide, vanadium oxide, or tin oxide. In another particular embodiment, each of the transparent conductive layers 104, 108, 128, 148, or 164 may be comprised of indium oxide doped with at least one of: aluminum oxide, titanium oxide, zirconium oxide, vanadium oxide, or tin oxide. In another particular embodiment, each of the transparent conductive layers 104, 108, 128, 148, or 164 may be a multi-layer structure comprised of at least a first layer formed from at least one of: zinc oxide, aluminum oxide, titanium oxide, zirconium oxide, vanadium oxide, or tin oxide; and a second layer comprised of zinc oxide doped with at least one of: aluminum oxide, titanium oxide, zirconium oxide, vanadium oxide, or tin oxide. In another particular embodiment, each of the transparent conductive layers 104, 108, 128, 148, or 164 may be a multi-layer structure comprised of at least a first layer formed from at least one of: zinc oxide, aluminum oxide, titanium oxide, zirconium oxide, vanadium oxide, or tin oxide; and a second layer comprised of indium oxide doped with at least one of: aluminum oxide, titanium oxide, zirconium oxide, vanadium oxide, or tin oxide.

In particular embodiments, each of the conductive layers 124, 144, or 168 is comprised of at least one metal or metallic layer. By way of example and not by way of limitation, each of conductive layers 124, 144, or 168 may be formed of one or more layers each individually or collectively containing at least one of: aluminum (Al), titanium (Ti), vanadium (V), chromium (Cr), manganese (Mn), iron (Fe), cobalt (Co), nickel (Ni), copper (Cu), zirconium (Zr), niobium (Nb), molybdenum (Mo), ruthenium (Ru), rhodium (Rh), palladium (Pd), platinum (Pt), silver (Ag), hafnium (Hf), tantalum (Ta), tungsten (W), rhenium (Re), iridium (Ir), or gold (Au). In one particular embodiment, each of conductive layers 124, 144, or 168 may be formed of one or more layers each individually or collectively containing at least one of: Al, Ti, V, Cr, Mn, Fe, Co, Ni, Cu, Zr, Nb, Mo, Ru, Rh, Pd, Pt, Ag, Hf, Ta, W, Re, Ir, or Au; and at least one of: boron (B), carbon (C), nitrogen (N), lithium (Li), sodium (Na), silicon (Si), phosphorus (P), potassium (K), cesium (Cs), rubidium (Rb), sulfur (S), selenium (Se), tellurium (Te), mercury (Hg), lead (Pb), bismuth (Bi), tin (Sn), antimony (Sb), or germanium (Ge). In another particular embodiment, each of conductive layers 124, 144, or 168 may be formed of a Mo-based layer that contains Mo and at least one of: B, C, N, Na, Al, Si, P, S, K, Ti, V, Cr, Mn, Fe, Co, Ni, Cu, Zn, Ga, Ge, Se, Rb, Zr, Nb, Mo, Ru, Rh, Pd, Ag, Cs, Hf, Ta, W, Re, Ir, Pt, Au, Hg, Pb, or Bi. In another particular embodiment, each of conductive layers 124, 144, or 168 may be formed of a multi-layer structure comprised of an amorphous layer, a face-centered cubic (fcc) or hexagonal close-packed (hcp) interlayer, and a Mo-based layer. In such an embodiment, the amorphous layer may be comprised of at least one of: CrTi, CoTa, CrTa, CoW, or glass; the fcc or hcp interlayer may be comprised of at least one of: Al, Ni, Cu, Ru, Rh, Pd, Ag, Ir, Pt, Au, or Pb; and the Mo-based layer may be comprised of at least one of Mo and at least one of: B, C, N, Na, Al, Si, P, S, K, Ti, V, Cr, Mn, Fe, Co, Ni, Cu, Zn, Ga, Ge, Se, Rb, Zr, Nb, Mo, Ru, Rh, Pd, Ag, Cs, Hf, Ta, W, Re, Ir, Pt, Au, Hg, Pb, or Bi.

In particular embodiments, Plasma Spray Deposition may be used to deposit each of the conversion layers 106, 126, 146, or 166, including one or both of the constituent absorber and buffer layers, which, as described above, may themselves be comprised of multiple layers. Other layers described above may, in some embodiments, also be deposited with Plasma Spray Deposition, such as, for example, each of the transparent conductive layers 104, 108, 128, 148, or 164, as well as each of the conductive layers 124, 144, or 168. More particular embodiments of absorber layers suitable for use in, for example, conversion layers 106, 126, 146, or 166, as well as methods of manufacturing the same, will now be described with reference to FIG. 2.

Copper indium gallium diselenide (e.g., $Cu(In_{1-x}Ga_x)Se_2$, where x is less than or equal to approximately 0.7), copper indium gallium selenide sulfide (e.g., $Cu(In_{1-x}Ga_x)(Se_{1-y}S_y)_2$, where x is less than or equal to approximately 0.7 and where y is less than or equal to approximately 0.99), and copper indium gallium disulfide (e.g., $Cu(In_{1-x}Ga_x)S_2$, where x is less than or equal to approximately 0.7), each of which is commonly referred to as a "CIGS" material or structure, have been successfully used in the fabrication of thin film absorbers in photovoltaic cells largely due to their relatively large absorption coefficients. In fact, photovoltaic cells having photovoltaic efficiencies greater or equal than approximately 20% have been manufactured using copper indium gallium diselenide absorber layers.

Common or conventional deposition methods that have been proposed or used for depositing the constituent metallic components during the fabrication of photovoltaic absorbers, and particularly chalcogenide/chalcopyrite absorbers, include evaporation, sputter deposition, electro-deposition, and printing/solution coating, among others. However, numerous problems and challenges are still faced with these conventional deposition techniques. By way of example, raw material variability is a major issue due to the relatively small quantities that are used on a per batch basis (e.g., sputtering targets). Additionally, system down time and service interruptions constitute a large fraction of operational time.

The goals of the deposition process include obtaining preferred chalcopyrite phases, defect free microstructures, stoichiometric consistency, and thickness uniformity in the resultant thin film absorber layers. Additionally, in general, large grains are desirable due to the minimization of grain boundaries and other imperfections that could serve as recombination centers for electrons in the semiconducting absorber layer (or other layers) and thus degrade device performance. Low cost, broad process windows (e.g., larger tolerances and/or more room for error) and rapid manufacturing feasibility are also highly desirable attributes as the photovoltaic industry enters the mass manufacturing phase.

Particular embodiments of the present disclosure utilize a technique known as Plasma Spray Deposition (or plasma spraying) for fabricating photovoltaic devices, and in particular, the absorber layers of these photovoltaic devices. Additionally or alternately, the described Plasma Spray Deposition techniques may be utilized to fabricate other thin films (e.g., buffer layers in the conversion layers, conductive layers, among others) in photovoltaic devices or other devices that include thin films. Plasma Spray Deposition is generally a method of thermal spraying using a plasma jet. Conventionally, Plasma Spray Deposition has been used to deposit coatings having thicknesses from micrometers (μm) to several millimeters (mm) and, furthermore, has been used to deposit coatings from a variety of materials including, by way of example, metals, ceramics, polymers and composites. However, the present inventors have determined that thin film absorber layer thicknesses as thin as approximately 1 nanometer (nm) may be precisely and uniformly produced using the Plasma Spray Deposition techniques described herein.

Figure 2:
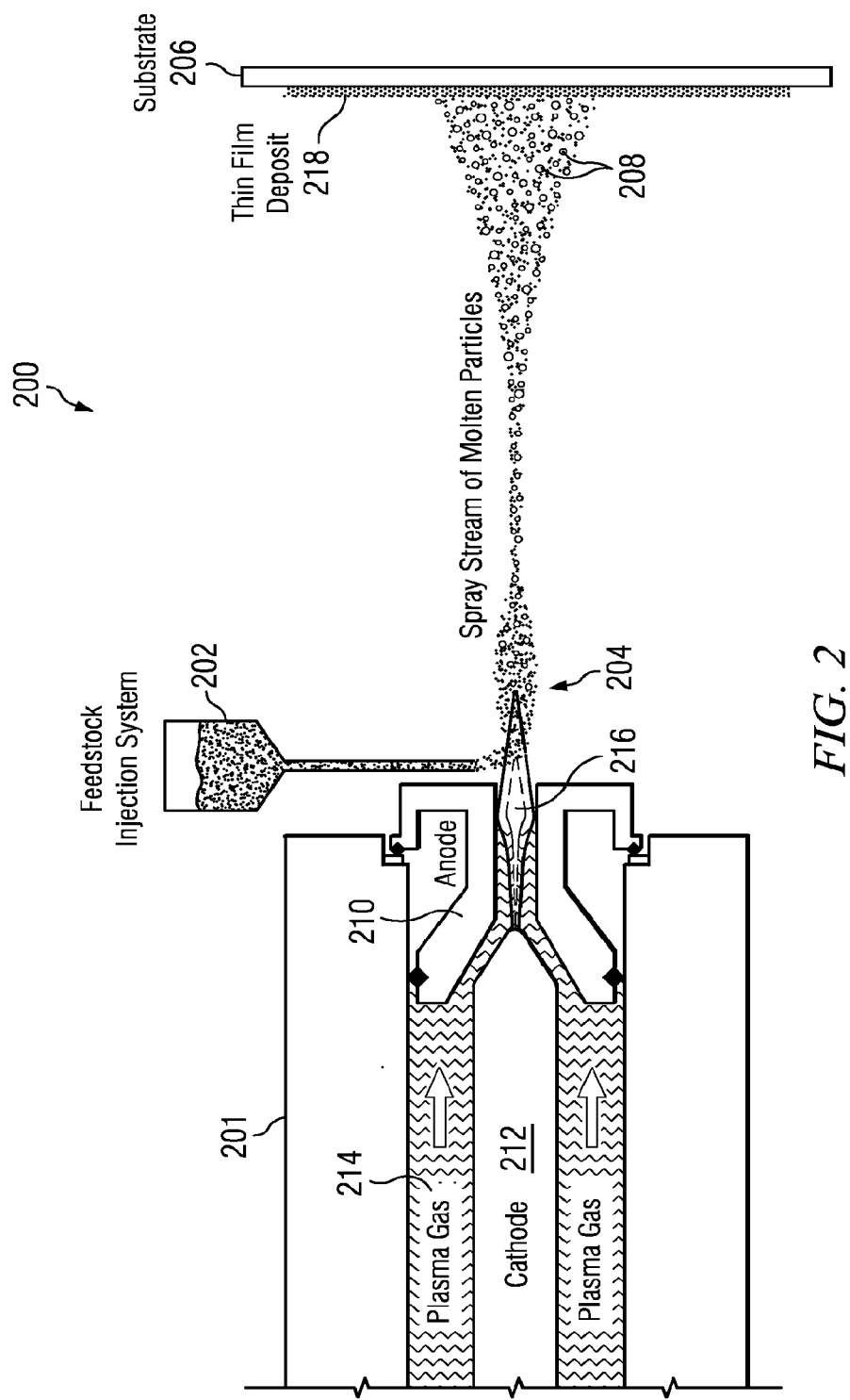
FIG. 2 illustrates and example Plasma Spray Deposition system.

FIG. 2 illustrates an example Plasma Spray Deposition system 200. The Plasma Spray Deposition process basically involves the spraying of molten or heat-softened material onto a surface to produce a coating, and more specifically as described herein, a thin film. In general, the material (or materials) to be deposited is referred to as feedstock (e.g., in the form of a powder, a liquid, a suspension, or wire) and is introduced (injected) from a feedstock injection system 202 into the plasma jet 204, emanating from a plasma flame (torch). In the plasma jet 204, where the temperature may be on the order of approximately 10,000 Kelvin, the feedstock material is rapidly heated and melted and then accelerated to a high velocity and propelled towards a substrate 206 in the form of molten droplets 208. The sprayed or ejected hot molten droplets impact the substrate surface (or previously deposited layers thereon) and rapidly cool forming a thin film deposit. In particular embodiments, such a Plasma Spray Deposition process may be referred to as a "cold process" (relative to the substrate material being coated) as the substrate temperature can be kept low during processing thereby avoiding damage, metallurgical changes, and distortion to the substrate material.

In an example embodiment, the plasma sprayer (or plasma spray gun) 201 includes a copper anode 210 and a tungsten cathode 212, both of which may be water cooled. Plasma gas (e.g, argon, nitrogen, hydrogen, helium, or other suitable gas) 214 flows around the cathode 212 and through the anode 210 which is shaped as a constricting nozzle. The plasma itself may be initiated by a high voltage discharge which causes localized ionization and a conductive path for a DC (direct current) arc to form between the cathode 212 and anode 210. The resistance heating from the arc causes the plasma gas 214 to reach extreme temperatures, dissociate and ionize to form a plasma (plasma flame) 216. The plasma 216 exits the nozzle formed by the anode 210 as a free or neutral plasma jet 204 (plasma which does not carry electric current), which is quite different to the Plasma Transferred Arc coating process where the arc extends to the surface to be coated. When the plasma 216 is stabilized and ready for spraying, the electric arc extends down the nozzle, instead of shorting out to the nearest edge of the anode 210. This stretching of the arc is due to a thermal pinch effect. Cold gas around the surface of the water-cooled anode 210 nozzle, being electrically non-conductive, constricts the plasma arc, raising its temperature and velocity. In embodiments using feedstock powder, the feedstock powder is fed into the plasma jet 204 via the feedstock injection system 202, which may include an external powder port mounted near the anode 210 nozzle exit.

The powder (or other feedstock) is so rapidly heated and accelerated by the plasma jet 204 that spray distances can be in the order of 25 to 150 mm. In some embodiments, the Plasma Spray Deposition process is conducted in normal atmospheric conditions (referred to as APS). In alternate embodiments, the Plasma Spray Deposition process is conducted in protective or other suitable or desired environments using vacuum chambers normally back filled with a protective or other suitable or desired gas at low pressure (referred to as VPS or LPPS).

Upon striking the substrate 206 (or previously deposited layers thereon), the molten droplets 208 flatten, rapidly solidify, and form a deposit. The deposited material remains adherent to the substrate 206 as a thin film 218. There are generally a large number of technological parameters that influence the interaction of the particles (of the material to be deposited) with the plasma jet 204 and the substrate 206, and therefore, the resultant deposit properties. These parameters include, by way of example and not by way of limitation, feedstock type, plasma gas composition and flow rate, energy input, torch offset distance, substrate cooling, among other possible parameters.

The resultant thin film 218 is comprised of a multitude of overlying and neighboring pancake-like lamellae also referred to as 'splats', formed as a result of the flattening of the liquid droplets 208 upon or after striking the surface of the substrate 206 (or previously deposited material thereon). In embodiments in which feedstock powder is used, the lamellae may have thicknesses on the order of or smaller then the size of the feedstock powder particulates (or particles) but may have a much larger lateral dimension, perhaps 2, 10, 100, or more times the thickness. Between these lamellae, there are small grain boundaries comprising voids, such as pores, cracks and regions of incomplete bonding. As a result of this unique lamellae-composite structure, the thin film 218 may have properties significantly different from the corresponding bulk material properties. These may generally be mechanical properties, such as lower strength and modulus, higher strain tolerance, and lower thermal conductivity. Also, due to the rapid solidification, metastable phases can be present in the thin-film deposits.

The Plasma Spray Deposition techniques described herein in various example embodiments offer a number of extremely attractive attributes. By way of example, the use of large raw material feedstock batches minimizes lot to lot variability. Furthermore, the feed source is immune to process-induced modification. Additionally, Plasma Spray Deposition provides extremely high throughput, good uniformity in the resultant thin film 218, large flat-grained structures, and broad flexibility in raw material selection, as well as tight control of stoichiometry in the resultant thin films. Furthermore, with the careful control of the deposition rate and the molten droplet size the disclosed Plasma Spray Deposition techniques can be used on a variety of substrate materials. Thermal mismatch stresses can also be minimized by controlling the interval between spray cycles as the film 218 is deposited.

Furthermore, in particular embodiments, photovoltaic absorber precursor thin films, or absorber thin films themselves, that have been deposited with the Plasma Spray Deposition techniques described herein with reference to example embodiments can be subsequently processed to improve their structural, chemical, and/or electronic properties. In particular embodiments, post processing annealing, hot-isostatic-pressing and/or other similar processes may be used to improve densification and microstructural properties of the deposited films 218. These processes can be conducted in reactive environments to improve the deposited film's structural, chemical or electronic properties. By way of example, such subsequent processing may include annealing at high temperature in the presence of sulfur (S), selenium (Se), or hydrogen sulfide ($H_2S$), among other suitable or desired gaseous environments. In particular embodiments in which it is desired to maximize the chalcopyrite phase in a chalcogenide-based absorber layer, such post-processing may increase the conversion to the chalcopyrite phases.

It should also be noted that the extremely large grains that are formed by the collision of the molten particles 208 with the substrate 206 have sizes (diameters) far in excess of what can be obtained by other deposition techniques where the grain diameters (the dimension parallel to the plane of the film) are typically on the order of the film thickness (the dimension perpendicular to the plane of the film) (e.g., on the order of 1 nm to 10 nm). However, in particular embodiments, the thin films deposited using Plasma Spray Deposition may exhibit an average grain size or average "grain diameter" of, for example, two, ten, a hundred or more times the thin-film thickness leading to idealized grain boundary minimization.

In addition, the feedstock materials that may be used to deposit the desired thin film or films 218 can include the constituent elements, compounds, or alloys desired in the resultant deposited thin films in suitable combination. By way of example, for depositing $CuInS_2$ type absorbers for photovoltaic devices, the feedstock may be comprised of $CuInS_2$ powder alone or in combination with one or more of $CuGa$, $In_2S_3$, and/or $CuS$ powder, among others. In some embodiments, the specific feedstock blend may also be altered during the Plasma Spray Deposition process to obtain compositional grading, if desired. By way of example, for the case of $Cu(In-Ga)Se_2$ (CIGS) absorbers the feedstock may comprise appropriate stoichiometric mixtures of $Cu$, $CuGa$, and/or $In_2S_3$ as well as various other elemental, alloy or compound mixtures. Indeed, an attractive attribute of utilizing Plasma Spray Deposition according to particular example embodiments is the fact that additions can be made to the feedstock to compensate for any stoichiometric variability between the feedstock and deposited films 218. By way of example, additions may be made to compensate for losses of more volatile or lower melting point constituents.

In particular embodiments, the feedstock can be compositionally varied with or without the presence of additives (e.g. oxide particles) to deposit a variety of multilayer structured films or layers as well as microstructurally confined nanocrystalline semiconductor particles (commonly referred to as quantum dots). The resulting structures have excellent light absorption characteristics (high extinction coefficients) and are "tunable" so as to extend their wavelength sensitivity and hence conversion efficiencies.

Furthermore, the present inventors have determined that Plasma Spray Deposition may improve the sticking of deposited layers 218 to each other, to other deposited layers, or to the substrate 206. More particularly, a conventional problem in the formation of photovoltaic cells is that the bottom contact layer (e.g., Molybdenum) tends not to stick to the underlying glass substrate and, in some instances, the adhesion between the absorber layer and the underlying bottom contact layer is poor. However, the present inventors have found that plasma spraying can improve the sticking. This may be a direct result of the larger grains in the plasma sprayed layers. Neighboring grains may have slightly different thicknesses at the boundaries. This mismatch may actually improve sticking between adjacent layers (e.g., the bottom contact layer and the glass substrate layer) through inter-penetrating surface features; analogous to a mechanical stitching of the layers.

Again, it should be appreciated that the embodiments described herein are not limited to the deposition of chalcopyrite photovoltaic absorber materials, but can be applied for all the other layers that constitute a photovoltaic device such as, by way of example and not by way of limitation, top and bottom contact layers, transparent conductive layers, interlayers, and protective transparent layers. Moreover, plasma spraying may be used for depositing silicon (Si) or other semiconducting crystalline think films. By way of example, one could reuse or recycle the Si powder leftover after slicing Si ingots into wafers or dicing wafers into dice to make Si thin films. One could also process the high purity silicon powder produced from various fluidized bed processes. Plasma spray deposition may also be very advantageous in creating microcrystalline silicon on glass type structures and provide substantial film thicknesses without the attendant stress related failures that are inherent to other deposition and fabrication pathways (for example, CVD, sputtering etc).

The present disclosure encompasses all changes, substitutions, variations, alterations, and modifications to the example embodiments described herein that a person having ordinary skill in the art would comprehend. Similarly, where appropriate, the appended claims encompass all changes, substitutions, variations, alterations, and modifications to the example embodiments described herein that a person having ordinary skill in the art would comprehend.

What is claimed is:
1. A photovoltaic device, comprising:
   a substrate;
   a bottom contact layer positioned over the substrate;
   one or more semiconducting absorber layers positioned over the bottom contact layer;
   a top contact layer positioned over the absorber layer; and
   wherein one or more of the bottom contact layer, one or more semiconducting absorber layers, or top contact layer have an average grain size that is at least ten times larger than the thickness of the respective layer.

2. The photovoltaic device according to claim 1, wherein one or more of the bottom contact layer, one or more semiconducting absorber layers, or top contact layer have an average grain size that is at least 100 times larger than the thickness of the respective layer.

3. The photovoltaic device according to claim 1, wherein at least one of the one or more semiconducting absorber layers has a thickness of 1 nm to 10 nm.

\* \* \* \* \*